United States Patent
Tsui et al.

(10) Patent No.: US 12,408,372 B2
(45) Date of Patent: Sep. 2, 2025

(54) PROCESS METHOD FOR FABRICATING A THREE-DIMENSIONAL SOURCE CONTACT STRUCTURE

(71) Applicant: National Yang Ming Chiao Tung University, Hsinchu (TW)

(72) Inventors: Bing-Yue Tsui, Hsinchu (TW); Jui-Cheng Wang, Hsinchu (TW); Li-Tien Hsueh, Taipei (TW); Jui-Tse Hsiao, Taichung (TW)

(73) Assignee: NATIONAL YANG MING CHIAO TUNG UNIVERSITY, Hsinchu (TW)

( * ) Notice: Subject to any disclaimer, the term of this patent is extended or adjusted under 35 U.S.C. 154(b) by 435 days.

(21) Appl. No.: 18/098,930

(22) Filed: Jan. 19, 2023

(65) Prior Publication Data

US 2024/0097018 A1 Mar. 21, 2024

(30) Foreign Application Priority Data

Sep. 15, 2022 (TW) .................................. 111134909

(51) Int. Cl.
*H10D 30/66* (2025.01)
*H01L 21/306* (2006.01)
(Continued)

(52) U.S. Cl.
CPC ....... *H10D 30/66* (2025.01); *H01L 21/30604* (2013.01); *H01L 21/3065* (2013.01); *H10D 30/0291* (2025.01); *H10D 64/021* (2025.01)

(58) Field of Classification Search
CPC ........... H01L 21/30604; H01L 21/3065; H01L 21/0485; H01L 21/28518; H01L 21/3081;
(Continued)

(56) References Cited

U.S. PATENT DOCUMENTS

| 6,297,100 B1 | 10/2001 | Kumar et al. |
| 8,476,697 B1 | 7/2013 | Cooper et al. |
| (Continued) |

FOREIGN PATENT DOCUMENTS

| CN | 102956501 A | 3/2013 |
| CN | 111937158 A | 11/2020 |
| (Continued) |

OTHER PUBLICATIONS

Jiang et al., "A Novel Implant Masking Processes for Double Self-Aligned 4H-SiC DMOSFETs," 2015 IEEE 11th International Conference on Power Electronics and Drive Systems, Sydney, Australia, Jun. 9-12, 2015, pp. 678-680.

*Primary Examiner* — Andres Munoz
(74) *Attorney, Agent, or Firm* — Birch, Stewart, Kolasch & Birch, LLP

(57) ABSTRACT

A process method for fabricating a three-dimensional source contact structure is provided, which is applicable to form a step-like three-dimensional source contact structure in a MOSFET of a power device. The proposed method sequentially adopts a lithography process and a shallow trench process to form a metal contact window. And a lateral etching process, or spacers which will be removed eventually, can be alternatively provided for increasing horizontal surface contact when depositing a source contact metal. Meanwhile, a longitudinal surface exposed by the shallow trench process is also beneficial to increase vertical contact when depositing the source contact metal. As a result, a step-like three-dimensional source contact structure can be formed by employing the present invention. It is believed that the present invention achieves in reducing cell pitch effectively and can be widely applied to various power devices having MOSFET structure thereof.

22 Claims, 12 Drawing Sheets

(51) Int. Cl.
*H01L 21/3065* (2006.01)
*H10D 30/01* (2025.01)
*H10D 64/01* (2025.01)

(58) Field of Classification Search
CPC .......... H01L 21/3083; H01L 21/76897; H01L 21/31144; H10D 30/0291; H10D 30/0295; H10D 30/66; H10D 62/393; H10D 62/8325; H10D 64/01; H10D 64/021; H10D 64/256; H10D 64/62; H10D 12/031
See application file for complete search history.

(56) References Cited

U.S. PATENT DOCUMENTS

| | | | | |
|---|---|---|---|---|
| 2010/0289073 A1* | 11/2010 | Hsieh | ................ | H10D 84/148 257/E21.546 |
| 2011/0006362 A1* | 1/2011 | Hsieh | ................ | H10D 30/0295 438/270 |
| 2012/0326227 A1* | 12/2012 | Burke | ................ | H10D 30/0295 438/270 |
| 2013/0256786 A1* | 10/2013 | Hsieh | ................ | H10D 64/117 438/270 |
| 2015/0171170 A1* | 6/2015 | Yamada | ............. | H10D 30/0291 257/77 |
| 2016/0126319 A1* | 5/2016 | Ogino | ................ | H01L 21/0485 438/586 |
| 2021/0126124 A1* | 4/2021 | Hsieh | ................ | H10D 62/107 |

FOREIGN PATENT DOCUMENTS

| | | |
|---|---|---|
| TW | 201301366 A | 1/2013 |
| TW | 202137554 A | 10/2021 |
| TW | 202215544 A | 4/2022 |

* cited by examiner

PROCESS METHOD FOR FABRICATING A THREE-DIMENSIONAL SOURCE CONTACT STRUCTURE

This application claims priority of Application No. 11134909 filed in Taiwan on 15, Sep. 2022 under 35 U.S.C. § 119; the entire contents of all of which are hereby incorporated by reference.

BACKGROUND OF THE INVENTION

Field of the Invention

The present invention is related to a source contact structure and its process method techniques. More particularly, the present invention is related to a process method for forming a three-dimensional source contact structure on a top surface of a power device.

Description of the Prior Art

As known, high-power Metal Oxide Semiconductor Field Effect Transistors (MOSFET) according to different channel types, mainly include Vertical Double Diffused Metal Oxide Semiconductor Field Effect Transistors (VDMOSFET) with a planar channel, and U-shaped Metal Oxide Semiconductor Field Effect Transistors (UMOSFET) with a vertical channel. In general, it is better for the high-power devices to have a smaller on-resistance. As the device area becomes larger, the on-resistance can be reduced. However, it should be noticed that under the condition of achieving the same on-state current, a larger device area also increases its fabrication cost. Therefore, to properly evaluate the on-resistance of a power device, it is fairly determined on a basis of the "resistance per unit area", which is also known as the specific on-resistance $R_{on,sp}$ (ohm-cm$^2$). It is believed that a lower specific on-resistance $R_{on,sp}$ indicates that the device performance is more superior.

And in order to obtain a high on-state current, it is more likely to parallelly connect a large number of transistors in a power device. Please find FIG. 1 of the present invention for references, in which a less length of the cell pitch 11 is believed to be able to increase the cell density of per unit area, thereby reducing the specific on-resistance $R_{on,sp}$ (ohm-cm$^2$). As a result, it is apparent that one major technique for reducing the specific on-resistance $R_{on,sp}$ (ohm-cm$^2$) of a high power device mainly lies in effectively shortening the cell pitch configured therein the device.

Among the current technologies, it has been provided a plenty of methodologies for shortening the cell pitch. Taking a VDMOSFET as an illustrative example, the methods may include shortening its channel length, reducing the overlapping length of its gate and source regions, reducing the spacing between adjacent P-type bodies (P-body), reducing the width of the contact window, reducing the contact width of the P-body and metal, and reducing the contact width of the source and metal, etc. Since the contact resistance ($R_{CS}$) is inversely proportional to the contact area ($A_C$), a less contact width of the source and metal, on the other hand, increases the contact resistance. In addition, it is also apparent that to obtain a smaller contact window, it requires high process complexity for contact window and metal deposition fabrications. Therefore, the process complexity of the power device will be significantly increased. Based on such reasons, the above-mentioned existing methodologies are normally limited by the minimum width of the contact window, the contact resistance between the source and metal, and so on. And thus, as the device size is getting scaled down nowadays, these existing methodologies are believed as not practical and feasible anymore.

Apart from the above, it has been well known that a standard source metal contact process may be performed as follows: after all the ion implantations and gate fabrication process are completed, a dielectric layer is deposited. Later, a source contact window is formed by employing a lithography process. Subsequently, metal deposition (nickel, for example, is usually used) can be performed. After annealing at a high temperature, the metal (nickel) and silicon carbide react to form Ni-silicide. And after removing the unreacted nickel metal, a structure as illustrated in FIG. 2 of the present invention can be formed. In FIG. 2, the formed Ni-silicide 211 is depicted by a solid pattern. Furthermore, in order to ensure the isolation between the source and the gate regions, a sufficient spacing "S" between the edge of the source contact window and the gate edge must be maintained. In general, the spacing S is usually between 0.5 µm and 1.0 µm. Meanwhile, a sufficient overlapping length "O" of the contact window and the source region, as illustrated in FIG. 2, is also necessary in order to reduce the contact resistance of the source and metal. Such overlapping length O is usually between 0.5 µm and 2.0 µm. At the same time, according to the public methods which have been disclosed in the existing patents and documents, the methods for improving the source contact resistance and reducing the cell pitch are mainly performed based on the self-aligned manners for obtaining a maximum contact area on the basis of the same cell pitch. Therefore, it is believed that the spacing between the contact window and the source region will be affected by the alignment errors of two lithography processes and line widths of two lithography/etching processes. Taking FIG. 2 as the explanatory example, assume that a minimum value of the overlapping length O is 0.5 µm, and the alignment process error is 0.2 µm, then it will be required to design the overlapping length O to be at least 0.7 µm (0.5 µm+0.2 µm=0.7 µm). And yet, even by doing so, when there is an alignment process error or offset generated in the fabrication process, such that the contact areas at the left and right sides of the source region are different, it also results in unfair contact resistances and leads to uneven current distributions. Therefore, the device reliability is degraded. From this point of view, it is obvious that a series of negative effects will thus be generated. As a result, it can be observed that for the current power devices, it is severely important for those skilled in the art to find an effective and balanced methodology for reducing the cell pitch and meanwhile avoiding the above-mentioned drawbacks and negative effects to be generated.

As set forth, on account of the above, in order to overcome the above-mentioned issues, it should be apparent that there is indeed an urgent need for the professionals in the field for a new and novel process method to be developed, that can effectively solve the foregoing problems existing in the prior arts. And by employing the proposed process method, the cell pitch can be effectively reduced under the condition of the same contact area. At the same time, it is believed that the foregoing deficiencies existing in the prior arts are solved as well. Regarding the detailed specific descriptions and implementations, the Applicants of the present invention will be providing in detail in the following paragraphs as below.

SUMMARY OF THE INVENTION

In order to overcome the above-mentioned disadvantages, one major objective in accordance with the present invention is provided for a novel process technology, which is aimed to fabricate a three-dimensional source contact structure between the metal and source region. By adopting the disclosed process method of the present invention, it effectively achieves in reducing the cell pitch and maintaining the same contact area at the left and right side of the source region. Meanwhile, a low process complexity of the disclosed process method can be obtained.

According to the disclosed process method of the present invention, in one embodiment, a silicon carbide shallow trench process along the metal contact window can be adopted, together with a lateral etching process applied to the inter-layer dielectric, such that the source contact metal is able to make contact with the source region both in a horizontal direction and in a vertical direction. In view of the process techniques provided by the present invention, it is believed that the cell pitch can be reduced by 0.6 μm and 1.0 μm, which is approximately 10% to 20% of the cell pitch. And the same contact area at the left and right side of the source region can be accomplished.

In another aspect, according to another embodiment of the present invention, it is also feasible to dispose a spacer respectively provided on opposite sidewall of a dielectric layer for sequentially performing a shallow trench process along the opposite surfaces of the two spacers. As such, the formed metal contact window can be extending downwardly. After the shallow trench process is complete, the spacers are removed, so as to expose the sufficient silicon carbide surface for increasing the horizontal surface contact when subsequent source metal deposition is performed.

On account of the disclosed process method, the present invention successfully fabricates a three-dimensional source contact structure. And by employing the three-dimensional source contact structure and its fabrication process method thereof, it is also believed that aspect ratio of the metal contact window can be reduced, which is beneficial to the subsequent metal deposition process. Moreover, the proposed technical contents of the present invention can be effectively applied to any power transistor which includes the Vertical Double Diffused Metal Oxide Semiconductor Field Effect Transistor (VDMOSFET) structure or the U-shaped Metal Oxide Semiconductor Field Effect Transistors (UMOSFET) structure. Alternatively, it can be further widely applied to any power transistor which includes the VDMOSFET or the UMOSFET structure, for example, an Insulated Gate Bipolar Transistor (IGBT), such that a step-like three-dimensional source contact metal can be deposited and obtained therein the transistor structure.

Apart from the above, regarding a practical application of the present invention, by adopting the disclosed process method for forming the three-dimensional source contact structure, it can be further widely applied to any high power device which includes the VDMOSFET structure, the UMOSFET structure, or even a MOSFET structure at its top surface. As a result, it is believed that the step-like three-dimensional source contact metal is applicable to the formation of the source contact metal of the VDMOSFET or the UMOSFET structure.

Based on the above, according to the process method disclosed by the Applicants of the present invention, the proposed process method is aimed to forming a source contact metal which is characterized by having a step-like three-dimensional structure. The disclosed process method is applicable to a power device, comprising a plurality of following steps. First, a semiconductor substrate is provided, and an epitaxial layer and a body region are sequentially formed on the semiconductor substrate. Later, a well region is provided and buried in the body region, and a source heavily doped area and an inter-layer dielectric are sequentially formed on the well region. After that, a metal contact window is formed in the power device, such that the inter-layer dielectric is divided by the metal contact window into a first dielectric layer and a second dielectric layer. And the source heavily doped area is also divided by the metal contact window into a first heavily doped region and a second heavily doped region.

According to the present invention, the first dielectric layer is disposed on the first heavily doped region, the second dielectric layer is disposed on the second heavily doped region, and a contact length of the first dielectric layer and the first heavily doped region is less than a length of the first heavily doped region such that a first metal-source surface contact region is exposed. Similarly, a contact length of the second dielectric layer and the second heavily doped region is less than a length of the second heavily doped region such that a second metal-source surface contact region is exposed. Therefore, on the basis of such structure feature, the present invention is able to proceed to deposit a source contact metal, such that the source contact metal is configured between the first dielectric layer and the second dielectric layer, between the first heavily doped region and the second heavily doped region, and on the well region. According to the disclosed process method of the present invention, the source contact metal is able to cover at least the above-mentioned first metal-source surface contact region, the above-mentioned second metal-source surface contact region, a longitudinal surface along the first heavily doped region and the second heavily doped region, and an interval surface between the first heavily doped region and the second heavily doped region, such that the source contact metal has a step-like three-dimensional structure.

Furthermore, according to disclosed process method in the present invention, the above-mentioned semiconductor substrate, the epitaxial layer, the first heavily doped region and the second heavily doped region have a first semiconductor type. And the body region and the well region have a second semiconductor type. And the first semiconductor type and the second semiconductor type are opposite conductivity types. In other words, the present invention is not limited to an N-type or P-type conductivity type. According to the disclosed technique characteristics proposed in the present invention, regarding the following embodiments provided by the present invention disclosed by the Applicants, an N-type silicon carbide is simply used as an illustrative example to implement the semiconductor substrate of the present invention for introducing the technical spirits of the invention. As a result, it is aimed to enable those skilled in the art to fully understand the technical solution of the present invention, and yet not to limit the application of the present invention. In other words, according to the process method disclosed in the present invention, its application field is certainly not limited to the N-type silicon carbide substrate but can also be widely applied to a variety of semiconductor substrates, including transistors with an N-type channel or a P-type channel. Also, substrates made of various semiconductor materials, such as silicon (Si), gallium oxide ($Ga_2O_3$), aluminum nitride (AlN), and diamond, etc. are applicable as well.

Among the technical contents, according to one embodiment of the present invention, the present invention is able to adopt a plurality of steps as follows to expose the above-mentioned first metal-source surface contact region and second metal-source surface contact region.

(a1): sequentially performing a lithography process to the inter-layer dielectric and performing a shallow trench process to the source heavily doped area to divide the inter-layer dielectric and the source heavily doped area and form a spacing (source contact window) there in between the inter-layer dielectric and the source heavily doped area.

(a2): performing a lateral etching process to the inter-layer dielectric wherein the spacing (source contact window) is formed to expose the first metal-source surface contact region and the second metal-source surface contact region and forming the first dielectric layer and the second dielectric layer. According to the embodiment, the lateral etching process for instance, can be performed by employing a wet etching process.

Alternatively, according to one another embodiment of the present invention, the present invention is also able to adopt a plurality of steps as follows to expose the above-mentioned first metal-source surface contact region and second metal-source surface contact region.

(b1): performing a lithography process to the inter-layer dielectric to divide the inter-layer dielectric into the first dielectric layer and the second dielectric layer formed on opposite sides (forming the source contact window).

(b2): providing a spacer respectively on opposite sidewalls of the first dielectric layer and the second dielectric layer.

(b3): performing a shallow trench process along opposite surfaces of two of the spacers to divide the source heavily doped area into the first heavily doped region and the second heavily doped region by the shallow trench process (forming the downwardly extending source contact window).

(b4): finally removing the spacers such that the required first metal-source surface contact region and the second metal-source surface contact region can be exposed.

According to the embodiment, the shallow trench process for instance, can be performed by employing a plasma etching process. In addition, the spacer used in the embodiment, for example, can be made of silicon nitride ($Si_3N_4$), silicon dioxide ($SiO_2$), nickel (Ni), or a material not removable when performing the shallow trench process Regarding performing the (b4) step when removing the spacers, according to one embodiment of the present invention, a hot phosphoric acid ($H_3PO_4$) can be used for effectively removing the spacers when the spacers are made of silicon nitride ($Si_3N_4$). Nevertheless, according to alternative embodiments of the present invention, when the spacers are made of other materials, then alternative removing agent can be adopted for removing the spacers as well.

Therefore, based on the above-mentioned technical solution, the present invention is able to adopt either of the process method as described above to expose the required first metal-source surface contact region and the second metal-source surface contact region for depositing the source contact metal in the subsequent process. According to the present invention, a length of the exposed first metal-source surface contact region and the second metal-source surface contact region is, for instance, between 0.2 µm and 1.0 µm. Preferably, the length can be 0.3 µm. As a result, due to the formation of the exposed first metal-source surface contact region and the second metal-source surface contact region, the present invention effectively increases the horizontal surface contact when depositing the source contact metal.

On the other hand, by adopting the above-mentioned shallow trench process, the present invention achieves in exposing the longitudinal surface along the first heavily doped region and the second heavily doped region. As for the exposed longitudinal surface, a depth of the longitudinal surface along the first heavily doped region and the second heavily doped region, for instance, can be between 0.2 µm and 0.5 µm. Therefore, due to the formation of the exposed longitudinal surface, the present invention effectively increases the longitudinal vertical contact when depositing the source contact metal. In general, the etching depth of the shallow trench process performed in the present invention, is not less than a thickness of the first heavily doped region and the second heavily doped region, such that the longitudinal surface having sufficient depth along the first heavily doped region and the second heavily doped region can be obtained and exposed.

Overall, according to the disclosed process techniques in the present invention, the process method can be applied to a power device, which is made of a semiconductor substrate, such as silicon substrate, silicon carbide (SiC) substrate, gallium oxide ($Ga_2O_3$) substrate, aluminum nitride (AlN) substrate, or a diamond substrate. Regarding the source contact metal to be deposited, a material of the source contact metal for example, may comprise Ni-silicide.

Generally evaluating, according to the disclosed process method for fabricating the three-dimensional source contact structure disclosed in the present invention, it is obvious that it can certainly be applied to a Vertical Double Diffused Metal Oxide Semiconductor Field Effect Transistor (VD-MOSFET) structure or an U-shaped Metal Oxide Semiconductor Field Effect Transistor (UMOSFET) structure. Alternatively, it can be further widely applied to any power transistor which includes the VDMOSFET or the UMOSFET structure, for example, an Insulated Gate Bipolar Transistor (IGBT). Overall, for people who are skilled in the art and having ordinary knowledge, appropriate modifications or changes based on the technical solutions disclosed in the present invention without departing from the spirit of the present invention are practicable. However, the modifications should still fall into the scope of the present invention. The present invention is certainly not limited thereto the disclosed parameters, conditions, as well as fields of the application.

Based on the disclosed technical features of the present invention, it is apparent that the present invention provides a three-dimensional source contact structure, and a process method for fabricating such three-dimensional source contact structure. By employing the process techniques, the present invention achieves in obtaining the purposes of effectively reducing the cell pitch under the same contact area. At the same time, it also maintains the same contact area at the left and right side of the source region and reduces the process complexity.

Below, the embodiments are described in detail in cooperation with the drawings, so that these and other objectives of the present invention will become obvious to those of ordinary skill in the art after reading the following detailed description of preferred embodiments. And technical contents, characteristics and accomplishments of the invention are easily comprehensive.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
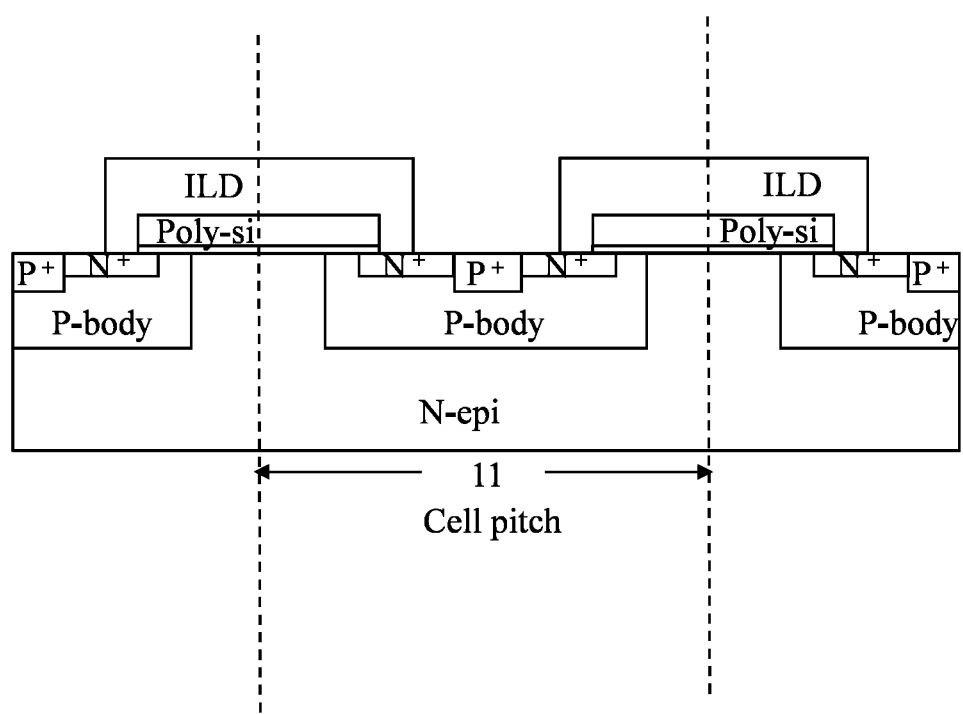
FIG. 1 schematically shows a structural diagram corresponding to a standard source contact metal process used in the prior art.
Figure 2:
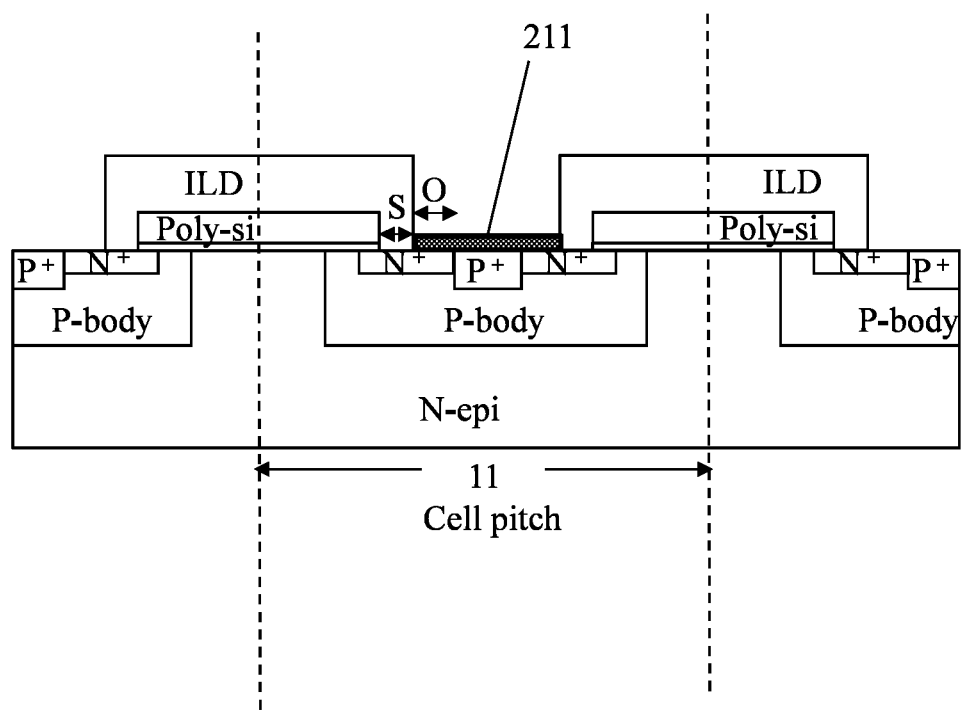
FIG. 2 schematically shows a structural diagram from FIG. 1 in which a Ni-silicide is deposited thereon.

It is to be understood that both the foregoing general description and the following detailed description are exemplary and are intended to provide further explanation of the invention as claimed.

Reference will now be made in detail to the preferred embodiments of the present invention, examples of which are illustrated in the accompanying drawings. Wherever possible, the same reference numbers are used in the drawings and the description to refer to the same or like parts.

The embodiments described below are illustrated to demonstrate the technical contents and characteristics of the present invention and to enable the persons skilled in the art to understand, make, and use the present invention. However, it shall be noticed that, it is not intended to limit the scope of the present invention. Therefore, any equivalent modification or variation according to the spirit of the present invention is to be also included within the scope of the present invention.

Figure 3:
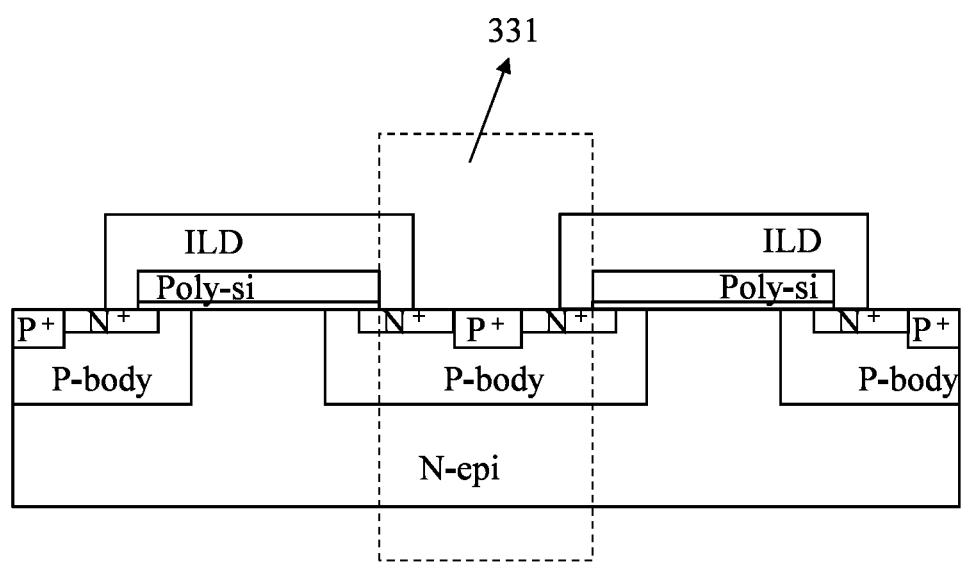
FIG. 3 schematically shows a structural diagram illustrating a source contact region where the modifications of the present invention are configured therein.

The present invention discloses a process method for fabricating a three-dimensional source contact structure, which is applicable to a power device, such that a source contact metal having a step-like three-dimensional structure can be formed in the power device. Since the present invention is aimed to improve and modify the current contact structure between the source region and metal, one objective of the present invention is to effectively reduce the device cell pitch under the condition of maintaining the same contact area. Meanwhile, contact areas at the left and right sides of the source region can be controlled to have the same area by utilizing a less process complexity manner, thereby making the present invention inventive and advantageous. Since the main technical spirits and solutions are provided based on the source contact structure and its fabrication process method thereof, the rest ion implantation and gate fabrication processes of the transistor are known as being similar to the current standard processes. As such, the similar descriptions are omitted in the present invention, and the Applicants of the present invention merely provide detailed descriptions regarding the source contact region 331 where the modifications are made, as illustrated in FIG. 3 for your references.

Figure 4:
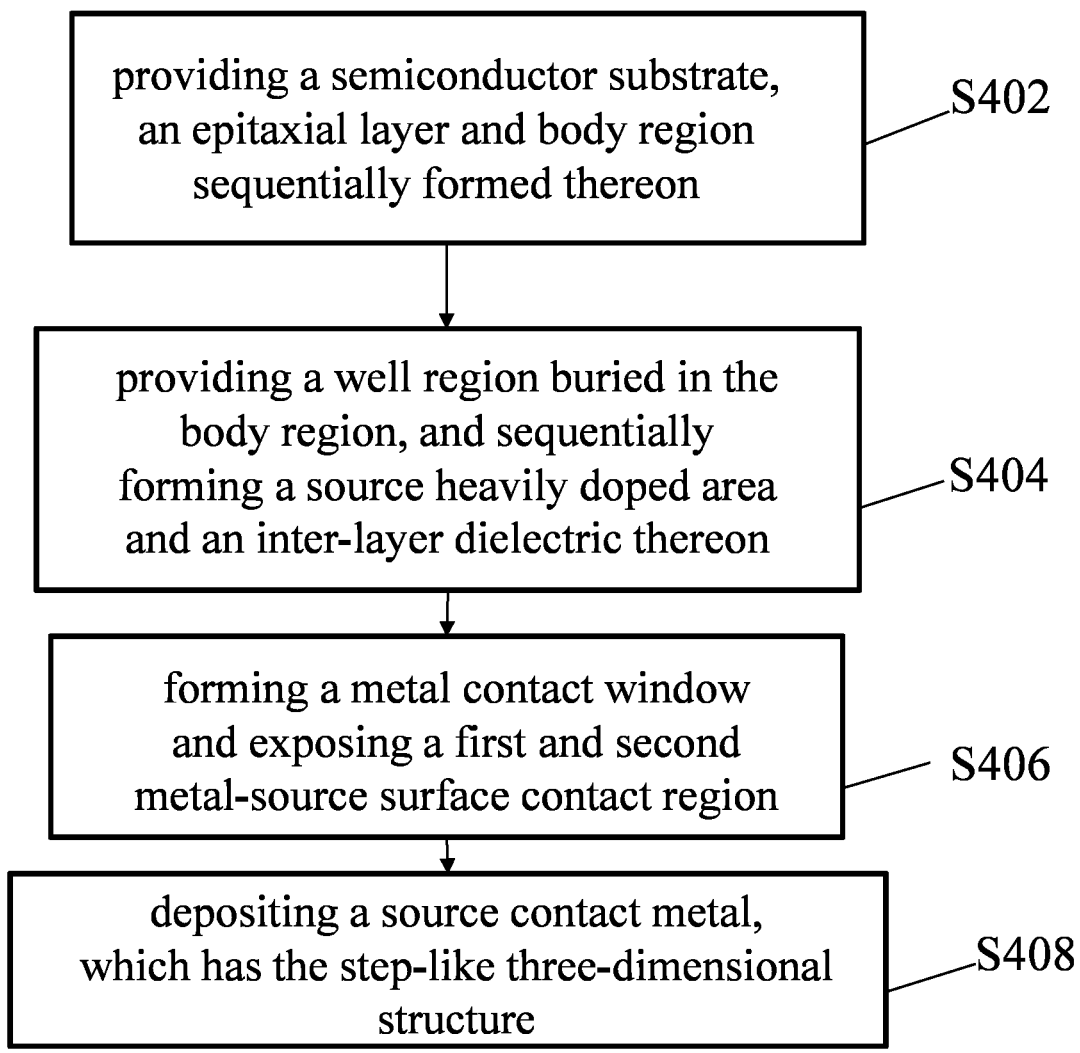
FIG. 4 shows a process flow chart illustrating the steps of the proposed fabrication process method of fabricating a three-dimensional source contact structure in accordance with the embodiment of the present invention.

Please refer to FIG. 4 which discloses a flow chart illustrating the steps of the proposed process method for fabricating a three-dimensional source contact structure in accordance with one embodiment of the present invention. According to the process method of the invention, the proposed process method mainly includes the steps S402, S404, S406 and S408. As can be seen in steps S402 and S404, the present invention firstly provides a semiconductor substrate of the power device, and an epitaxial layer and a body region are sequentially formed on the semiconductor substrate. Later, a well region is provided and buried in the body region.

And a source heavily doped area and an inter-layer dielectric are sequentially formed on the well region. Then, in the step of S406, a metal contact window is formed in the power device. By the formation of the metal contact window, the inter-layer dielectric and the source heavily doped area can be divided and a spacing can be formed therein. In addition, due to the metal contact window to be formed, a horizontal surface contact and a longitudinal vertical contact when depositing the source contact metal can be significantly increased. As such, as can be seen in the step of S408, when performing deposition of the source contact metal, the source contact metal is able to simultaneously contact the source region both in the vertical direction and in the horizontal direction. Therefore, the source contact metal has a step-like three-dimensional structure, which is the three-dimensional source contact structure provided by employing the present invention.

According to the disclosed process method for fabricating the three-dimensional source contact structure in the present invention, it is feasible and applicable to a power device, and forming a source contact metal having a step-like three-dimensional structure in the power device. In order to clearly and concisely describe the detailed implementations of the present invention, a basic VDMOSFET structure is used in the following descriptions as an exemplary embodiment for explaining the technical contents of the present invention. However, it should also be noted that such embodiment should not be taken for limiting the claim scope of the present invention. Within the scope of its equality, other variant modifications should still fall into the scope and claims of the present invention.

In view of the disclosed process method, when considering how to increase the horizontal surface contact when performing the source metal deposition, the Applicants of the invention provide at least two different process methods in the following paragraphs for references.

Figure 5:
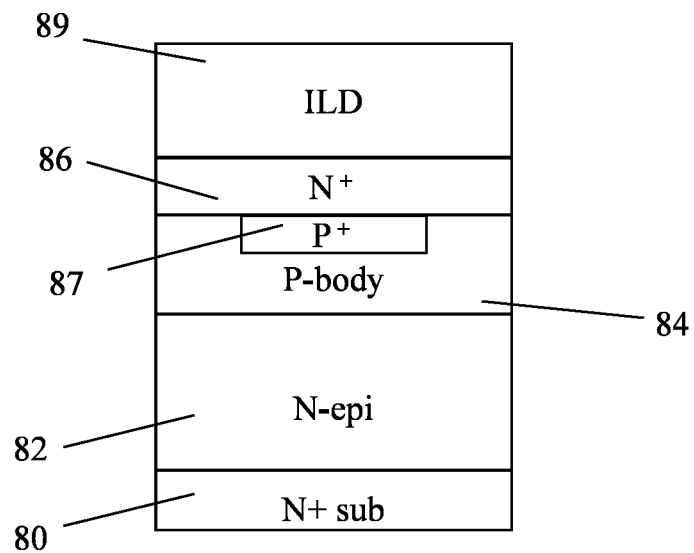
FIG. 5 schematically shows a structural diagram of a three-dimensional source contact structure in accordance with a first embodiment of the proposed process method of the present invention.

First, please refer to FIG. 5 to FIG. 9 for structural diagrams relatively corresponding to each step of the proposed process method according to a first embodiment of the present invention. As shown in the figures, the present invention provides a transistor structure as illustrated in FIG. 5 first, in which a semiconductor substrate 80, an epitaxial layer 82 and a body region 84 sequentially formed on the semiconductor substrate 80 are provided. Specifically, in one preferable embodiment of the present invention, the semiconductor substrate 80 can be a substrate made of N-type heavily doped silicon carbide (shown as "N+ sub" in the figures). And the epitaxial layer 82 (shown as "N-epi" in the figures) can be preferably an N-type SiC (silicon carbide) epitaxial layer which is formed by epitaxial growth on an upper surface of the semiconductor substrate 80. A P-type body implantation process can be utilized to form the body region 84 (shown as "P-body" in the figures). It is noted that the disclosed semiconductor substrate 80 should not be limited to an N-type SiC substrate. Alternative substrates made of other semiconductor materials, such as silicon (Si), gallium oxide ($Ga_2O_3$), aluminum nitride (AlN), and diamond, etc. are also applicable and feasible materials for forming the disclosed semiconductor substrate 80. The detailed descriptions provided in the following paragraphs simply use the N-type silicon carbide material as an illustrative implementation embodiment. Basically, in view of the same technical manners, those skilled in the art and have common knowledge backgrounds in the technical field are allowed to apply the technical solution disclosed in the present invention to the P-type semiconductor substrate, for instance. And the present invention spares the same descriptions.

Later, a well region 87 (shown as "P+" in the figures) is provided and buried in the body region 84 and a source heavily doped area 86 (shown as "N+" in the figures) and an inter-layer dielectric 89 (shown as "ILD" in the figures) are sequentially formed on the well region 87. According to the embodiment of the present invention, the well region 87 can be buried in the body region 84 through specific process steps such that the source heavily doped area 86 can be subsequently formed and disposed on the well region 87, thereby the structure as illustrated in FIG. as the first embodiment of the present invention can be obtained.

Figure 6:
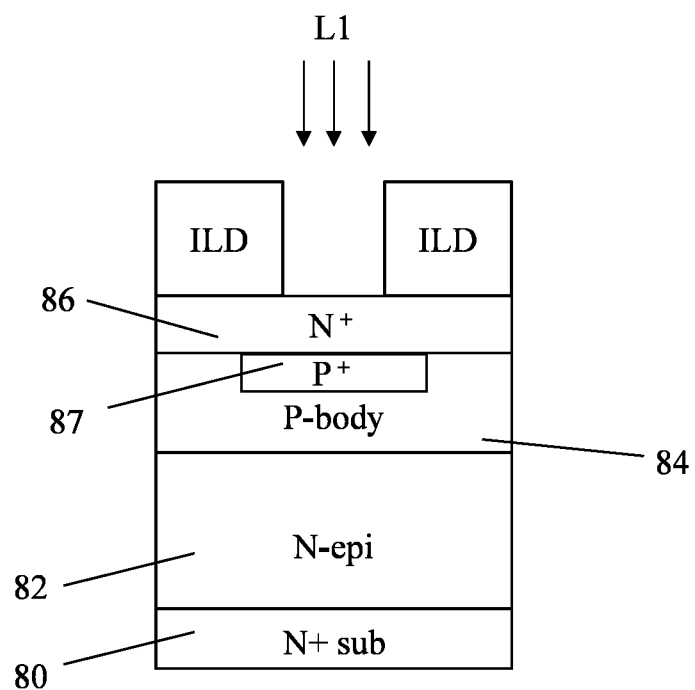
FIG. 6 schematically shows a structural diagram from FIG. 5 in which a lithography process is performed.
Figure 7:
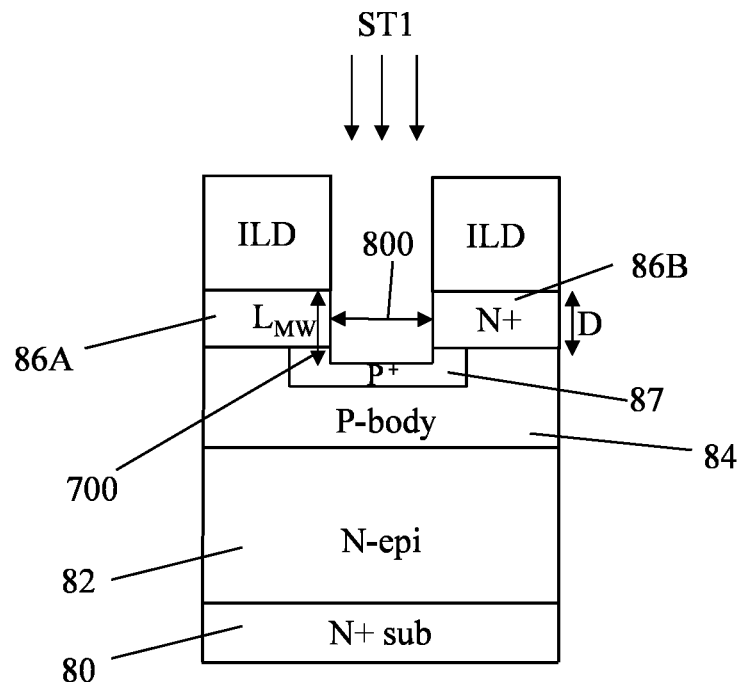
FIG. 7 schematically shows a structural diagram from FIG. 6 in which a shallow trench process is performed.
Figure 8:
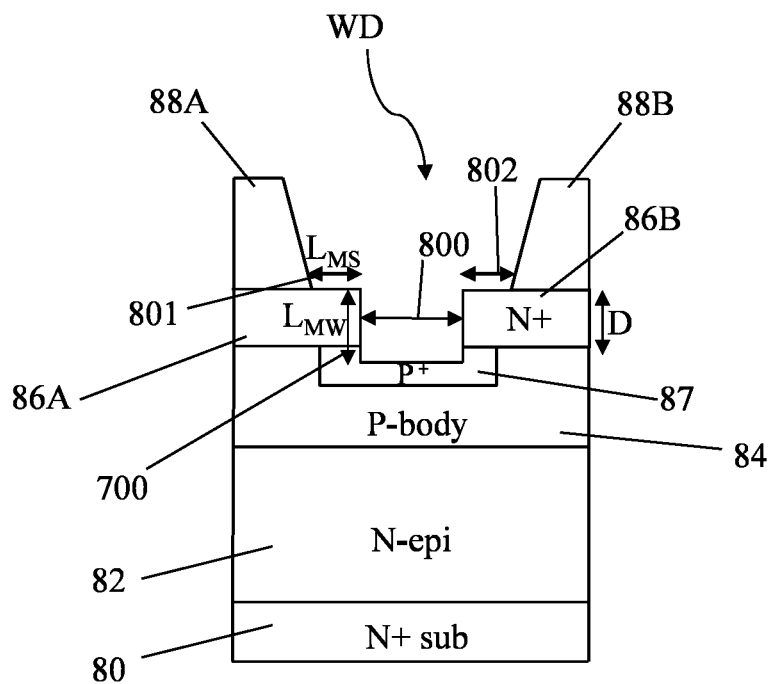
FIG. 8 schematically shows a structural diagram from FIG. 7 in which a lateral etching process is performed to expose the metal-source surface contact regions.

Please proceed to refer to FIG. 6, FIG. 7 and FIG. 8 for structural diagrams corresponding to the step of S406 in FIG. 4, describing the technical contents of forming the metal contact window in the power device according to the first embodiment of the present invention. For the detailed descriptions of this technical solution provided as follows, please refer to the flow chart shown in FIG. 10 at the same time. Firstly, as described in the step of S1002, the present invention proceeds to sequentially perform a lithography process to the inter-layer dielectric 89 and a shallow trench process to the source heavily doped area 86 to divide the inter-layer dielectric 89 and the source heavily doped area 86, and forms a spacing (also known as a source contact window) there in between the inter-layer dielectric 89 and the source heavily doped area 86. FIG. 6 shows a schematic diagram illustrating the lithography process L1 is applied to the inter-layer dielectric 89 such that the inter-layer dielectric 89 is divided for forming the source contact window. FIG. 7 shows a schematic diagram illustrating the shallow trench process ST1 is applied to etch and divide the source heavily doped area 86 (N+ silicon carbide).

Furthermore, it is apparent that the present invention adopts the shallow trench process ST1 as shown in FIG. 7 to divide the source heavily doped area 86 into a first heavily doped region 86A and a second heavily doped region 86B which are formed on opposite sides. Under such a condition, a longitudinal surface 700 which is along the first heavily doped region 86A and the second heavily doped region 86B, as well as an interval surface 800 which is between the first heavily doped region 86A and the second heavily doped region 86B are exposed. According to one preferable embodiment of the present invention, the disclosed process method of the invention mainly employs the shallow trench process ST1 to etch the source heavily doped area (N+ silicon carbide) and control an etching depth of the shallow trench process ST1 to be slightly greater than (not less than) a thickness D of the first heavily doped region 86A and the second heavily doped region 86B, such that the longitudinal surface 700 having sufficient depth along the first heavily doped region 86A and the second heavily doped region 86B can be obtained and exposed. Overall, generally according to the preferable embodiment of the present invention, a depth $L_{MW}$ of the longitudinal surface 700 along the first heavily doped region 86A and the second heavily doped region 86B, for instance, can be between 0.2 μm and 0.5 μm.

At this time, it is believed that on account of the exposed longitudinal surface 700 formed due to the employed shallow trench process ST1, the present invention effectively increases the longitudinal vertical contact when the source contact metal is subsequently deposited thereon the power device structure.

Figure 10:
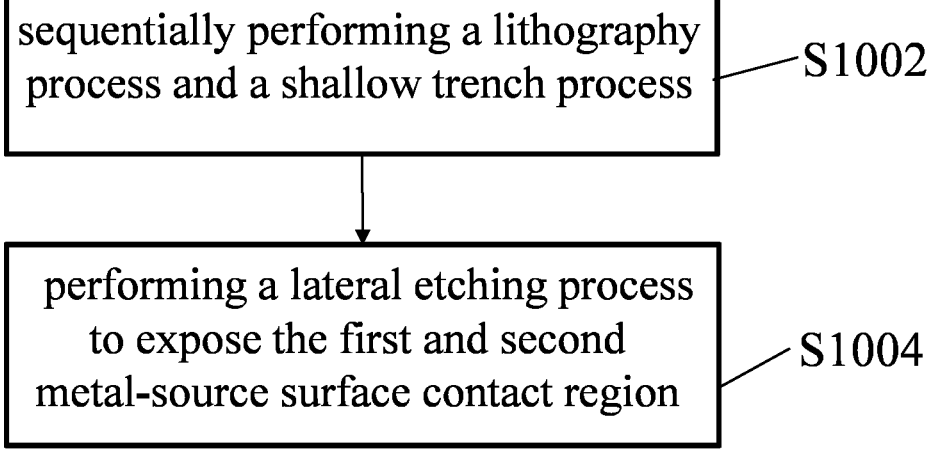
FIG. 10 schematically shows a process flow chart illustrating the steps of the proposed fabrication process method in accordance with the first embodiment of the present invention.

And next on, as described in the step of S1004 in FIG. 10, the present invention proceeds to perform a lateral etching process to the inter-layer dielectric wherein the spacing (the source contact window) is formed, such that the structure as illustrated in FIG. 8 can be obtained. Under such a condition, the lateral etching process is applied to the inter-layer dielectric 89 such that the first dielectric layer 88A and the second dielectric layer 88B which are formed on opposite sides are accordingly formed. According to such the embodiment of the present invention, it can be found that each of the first dielectric layer 88A and the second dielectric layer 88B is formed in a trapezoid shape.

At this time, as shown in FIG. 8, a metal contact window WD is accordingly obtained and formed in the transistor structure of the power device. And as such, the inter-layer dielectric 89 is divided by the metal contact window WD into the first dielectric layer 88A and the second dielectric layer 88B. In addition, the source heavily doped area 86 is also divided by the metal contact window WD into the first heavily doped region 86A and the second heavily doped region 86B.

And moreover, please also refer to FIG. 8. It can be found that, the first dielectric layer 88A is disposed on the first heavily doped region 86A, and the second dielectric layer 88B is disposed on the second heavily doped region 86B.

And a contact length of the first dielectric layer 88A and the first heavily doped region 86A is less than a length of the first heavily doped region 86A such that a first metal-source surface contact region 801 can be exposed. Similarly, a contact length of the second dielectric layer 88B and the second heavily doped region 86B is less than a length of the second heavily doped region 86B such that a second metal-source surface contact region 802 can be exposed, too. As a result, according to such a process step, it is believed that on account of the exposed first metal-source surface contact region 801 and the exposed second metal-source surface contact region 802 which are formed due to the applied lateral etching process, the present invention effectively increases the horizontal surface contact when the source contact metal is subsequently deposited thereon the power device structure.

To be more specific, according to such a first embodiment of the present invention, since the first metal-source surface contact region 801 and the second metal-source surface contact region 802 to be exposed, are formed by performing the lateral etching process to the inter-layer dielectric, and the lateral etching process for instance, can be performed by employing a wet etching process, the present invention is thus achieving in the objective that, an adequate length of the silicon carbide on the surface of the source region can be properly exposed, which is the length $L_{MS}$ of the first metal-source surface contact region 801 and the second metal-source surface contact region 802. According to the present invention, the length $L_{MS}$ of the exposed first metal-source surface contact region 801 and the second metal-source surface contact region 802 can be adjusted by controlling the process parameters of the lateral etching process. Normally, the length $L_{MS}$ can be controlled between 0.2 μm and 1.0 μm, preferably as 0.3 μm. As a result, in the present invention, the first metal-source surface contact region 801 and the second metal-source surface contact region 802 exposed by employing the lateral etching process can be utilized for increasing the horizontal surface contact when subsequent source metal deposition is performed.

And in a further aspect, according to the disclosed technical contents of the present invention, the above-mentioned length $L_{MS}$ of the exposed first metal-source surface contact region 801 and the second metal-source surface contact region 802 is generally dependent on the process parameters of the lateral etching process performed to the inter-layer dielectric. On the other hand, the depth $L_{MW}$ of the exposed longitudinal surface 700 is dependent on the process parameters of the shallow trench process performed to the source heavily doped area (N+). In general, the etching depth of the shallow trench process is approximately slightly more than (not less than) the thickness D of the first heavily doped region 86A and the second heavily doped region 86B, in order to expose a longitudinal surface 700 having sufficient depth $L_{MW}$.

Figure 9:
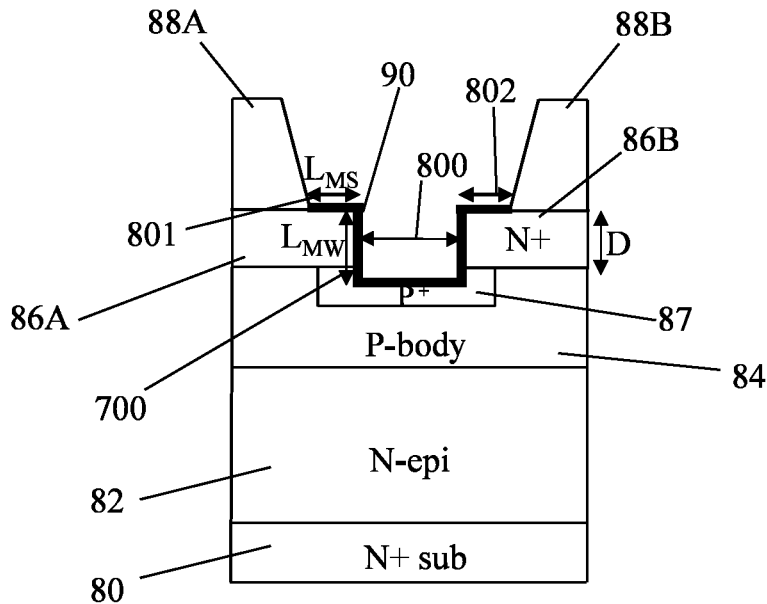
FIG. 9 schematically shows a structural diagram from FIG. 8 in which a source contact metal is deposited thereon.

As a result, as described in the step of S408 in FIG. 4, the present invention is able to proceed to deposit a source contact metal on the previously described structure, such that the source contact metal 90 as illustrated in FIG. 9 can be formed. On account of the above, it is believed that the source contact metal 90 formed by employing the disclosed process method is able to cover at least the above-mentioned first metal-source surface contact region 801, the above-mentioned second metal-source surface contact region 802, the longitudinal surface 700 along the first heavily doped region 86A and the second heavily doped region 86B, and the interval surface 800 between the first heavily doped region 86A and the second heavily doped region 86B, such that the source contact metal 90 formed by the present invention has a step-like three-dimensional structure. As earlier described in the previous sections, the source contact metal 90 can be formed, for example, by depositing a contact metal first, such as nickel (Ni), and annealing it at a high temperature to form nickel-silicide (Ni-silicide). After that, a selective etching process can be carried out to remove the unreacted nickel, such that the source contact metal 90 as shown in FIG. 9 can be formed. As a result, according to the embodiment of the present invention, the source contact metal 90 formed by the present invention is characterized by having a step-like three-dimensional structure. And after that, a variety of subsequent steps are mostly the same as the standard processes in the existing VDMOSFET fabrication process. As for the following gate contact window lithography, etching processes, as well as metal deposition and metal layer lithography processes, these processes may further be performed by those skilled in the art for the subsequent flow processes.

Figure 11:
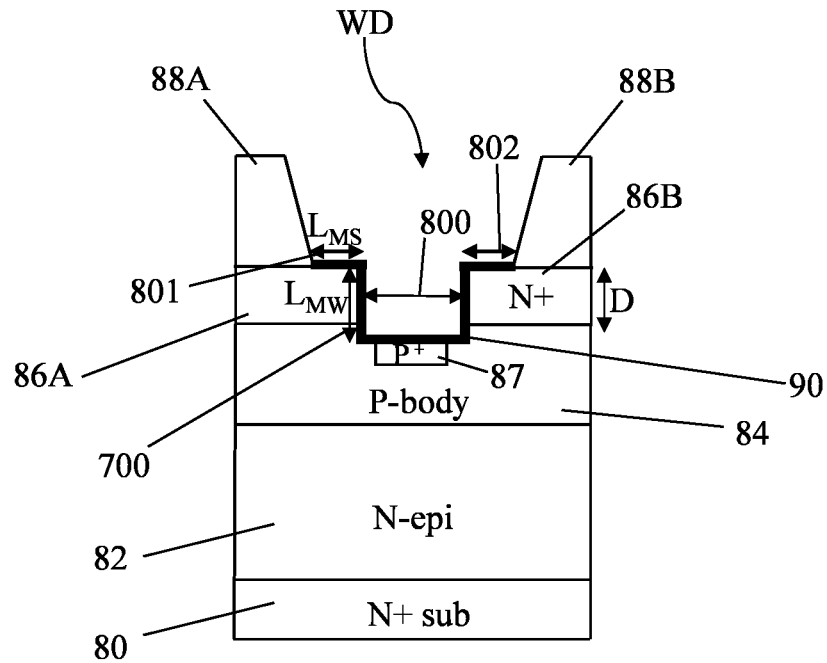
FIG. 11 schematically shows a structural diagram illustrating a width of the well region is narrower than a bottom width of the metal contact window in accordance with the first embodiment of the present invention.

It draws our attention that, according to the embodiment of the present invention, the width of the well region 87 is designed as being greater than the bottom width of the metal contact window WD, for the purposes of providing a larger metal contact window and a subsequent easier lithography process of the metal contact window. However, the present invention is certainly not limited thereto such embodiment. According to some other embodiments of the present invention, then the width of the well region 87 may also be alternatively designed as being narrower than the bottom width of the metal contact window WD. Please refer to FIG. 11 for a variant embodiment of the present invention, in which FIG. 11 shows a schematic view illustrating that the width of the well region is narrower than the bottom width of the metal contact window. It is believed that the variant embodiment may also be utilized for forming the three-dimensional source contact structure of the present invention.

And in a furthermore aspect of the invention, according to the technical contents disclosed by the Applicants of the invention, an outline structure of the disclosed first and second dielectric layers is not limited thereto the above-mentioned trapezoid shape in the earlier embodiment. According to other alternative embodiments of the present invention, the first and second dielectric layers may also be formed into various shapes and structures by employing some other adequate etching processes. It will be apparent to those skilled in the art that various modifications and variations can be made without departing from the spirits of the invention, and still fall within the scope of the invention.

And apart from the above-mentioned disclosed process method, when considering how to increase the horizontal surface contact when performing the source metal deposition, a second embodiment will be provided by the Applicants of the invention as discussed in the following paragraphs for references. Please refer to the detailed descriptions of the second embodiment of the present invention as follows.

Figure 12:
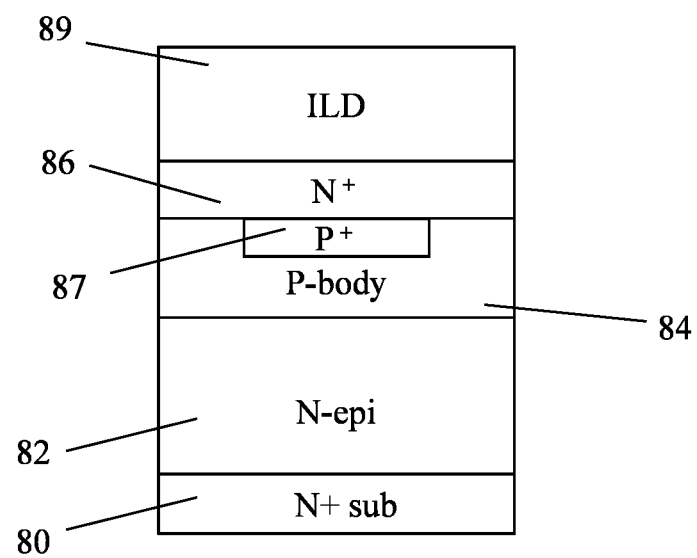
FIG. 12 schematically shows a structural diagram of a three-dimensional source contact structure in accordance with a second embodiment of the proposed process method of the present invention.

For a better understanding and comprehensive reading of the technical contents in view of the second embodiment, please refer to FIG. 12 to FIG. 17 for structural diagrams relatively corresponding to each step of the proposed process method according to the second embodiment of the present invention. As shown in the figures, the present invention provides a transistor structure at first, as illustrated in FIG. 12, in which a semiconductor substrate 80, an epitaxial layer 82 and a body region 84 sequentially formed on the semiconductor substrate 80 are provided. As previously described, the Applicants also provide an N-type silicon carbide material (SiC) as an exemplary example of the transistor structure for illustration. And yet, the present invention is not limited thereto such material. A well region 87 is provided and buried in the body region 84. And a source heavily doped area 86 is formed and deposited on the well region 87. After that, an inter-layer dielectric 89 is sequentially formed and deposited on the source heavily doped area 86, thereby the structure as illustrated in FIG. 12 as the second embodiment of the present invention can be obtained.

Figure 13:
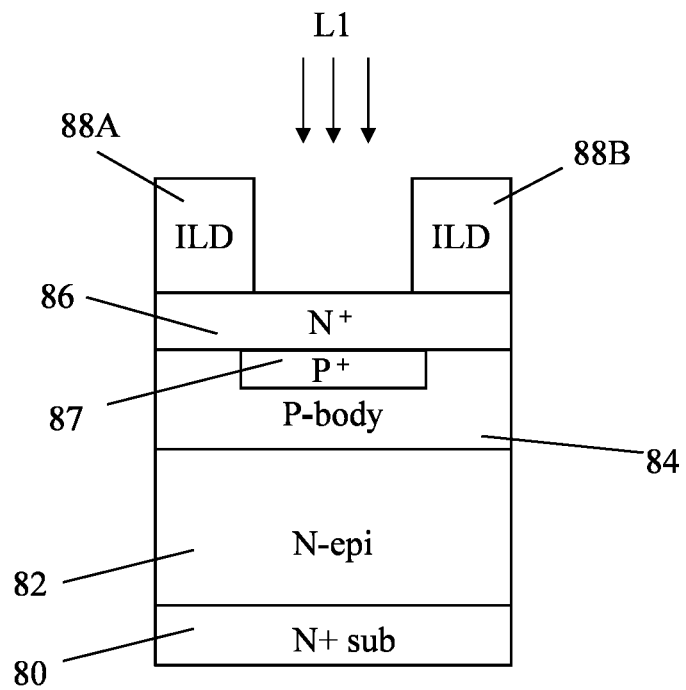
FIG. 13 schematically shows a structural diagram from FIG. 12 in which a lithography process is performed.

Please proceed to refer to FIG. 13 to FIG. 16 for structural diagrams corresponding to the step of S406 in FIG. 4, describing the technical contents of forming the metal contact window in the power device according to the second embodiment of the present invention. For the detailed descriptions of this technical solution provided as follows, please refer to the flow chart shown in FIG. 18 at the same time. Firstly, as shown in FIG. 13, according to the second embodiment, the present invention proceeds to perform a lithography process L 1 to the inter-layer dielectric 89 so as to form a source contact window in the inter-layer dielectric 89 and to divide the inter-layer dielectric 89 into the first dielectric layer 88A and the second dielectric layer 88B which are formed on opposite sides (corresponding to the step of S1802 in FIG. 18).

Figure 14:
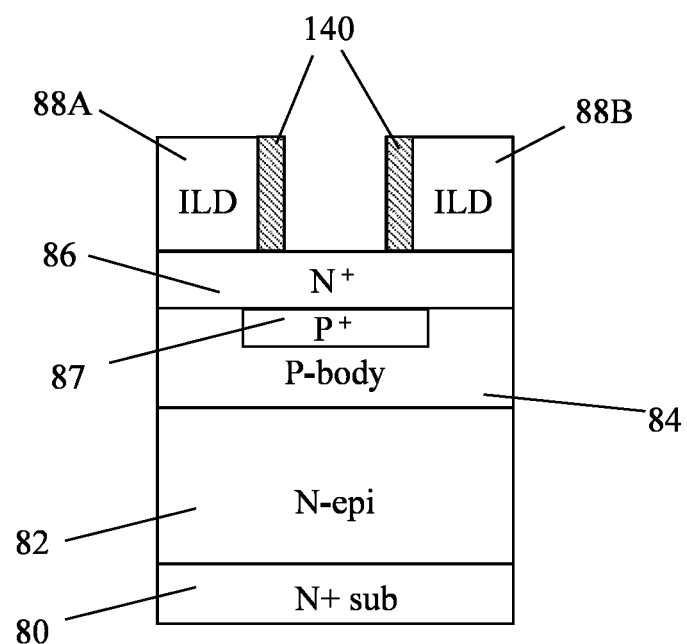
FIG. 14 schematically shows a structural diagram from FIG. 13 in which spacers are provided therein.
Figure 15:
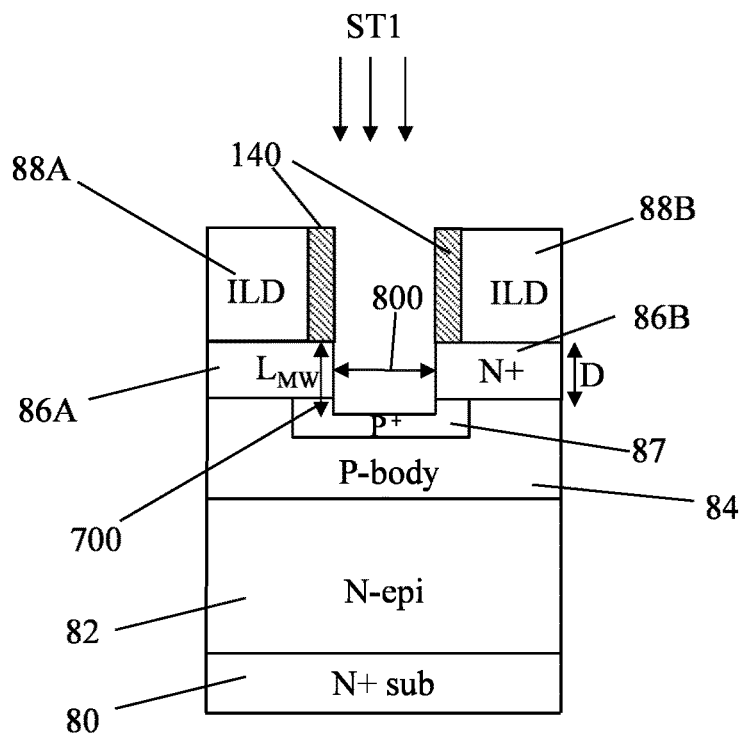
FIG. 15 schematically shows a structural diagram from FIG. 14 in which a shallow trench process is performed.

Later, as shown in FIG. 14, the present invention proceeds to provide a spacer 140 respectively on opposite sidewalls of the first dielectric layer 88A and the second dielectric layer 88B (corresponding to the step of S1804 in FIG. 18). And after that, as shown in FIG. 15, a shallow trench process ST1 is performed along opposite surfaces of the two spacers 140, such that the source heavily doped area 86 is divided into the first heavily doped region 86A and the second heavily doped region 86B which are formed on opposite sides (corresponding to the step of S1806 in FIG. 18). In details, according to the embodiment of the present invention, the foregoing shallow trench process ST1 to be performed, for instance, can be accomplished by utilizing a plasma etching process. At this time, on account of the shallow trench process ST1 and the downwardly extending source contact window, the present invention is able to divide the source heavily doped area 86 into the first heavily doped region 86A and the second heavily doped region 86B formed on opposite sides. Meanwhile, the longitudinal surface 700 along the first heavily doped region 86A and the second heavily doped region 86B, and the interval surface 800 between the first heavily doped region 86A and the second heavily doped region 86B are exposed. As discussed earlier in the previous first embodiment, the depth $L_{MW}$ of the exposed longitudinal surface 700 is dependent on the process parameters of the shallow trench process performed to the source heavily doped area (N+).

In general, the etching depth of the shallow trench process ST1 is approximately slightly more than (not less than) the thickness D of the first heavily doped region 86A and the second heavily doped region 86B, in order to expose a longitudinal surface 700 having sufficient depth $L_{MW}$. In one preferable embodiment of the present invention, the depth $L_{MW}$ of the longitudinal surface 700, for instance, can be between 0.2 μm and 0.5 μm.

Figure 16:
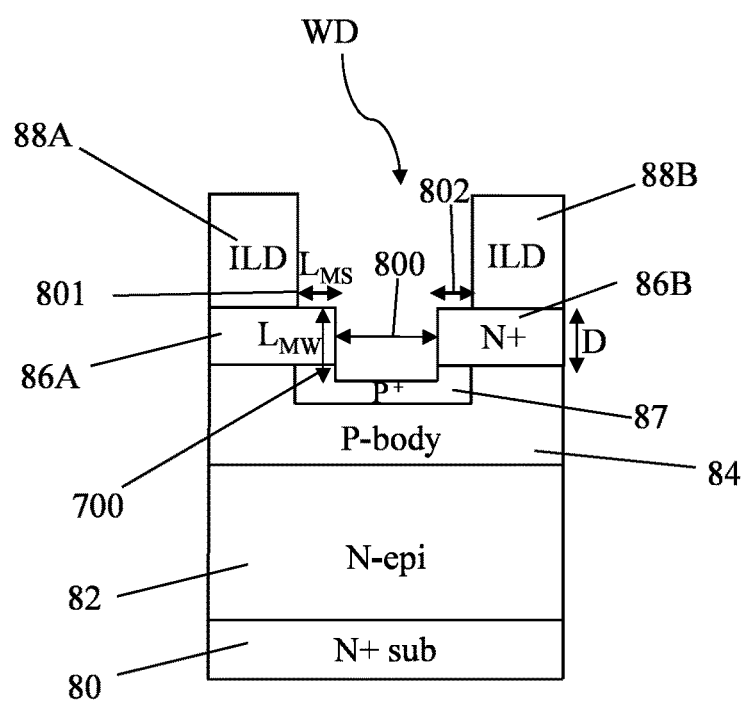
FIG. 16 schematically shows a structural diagram from FIG. 15 in which the spacers are removed to expose the metal-source surface contact regions.
Figure 18:
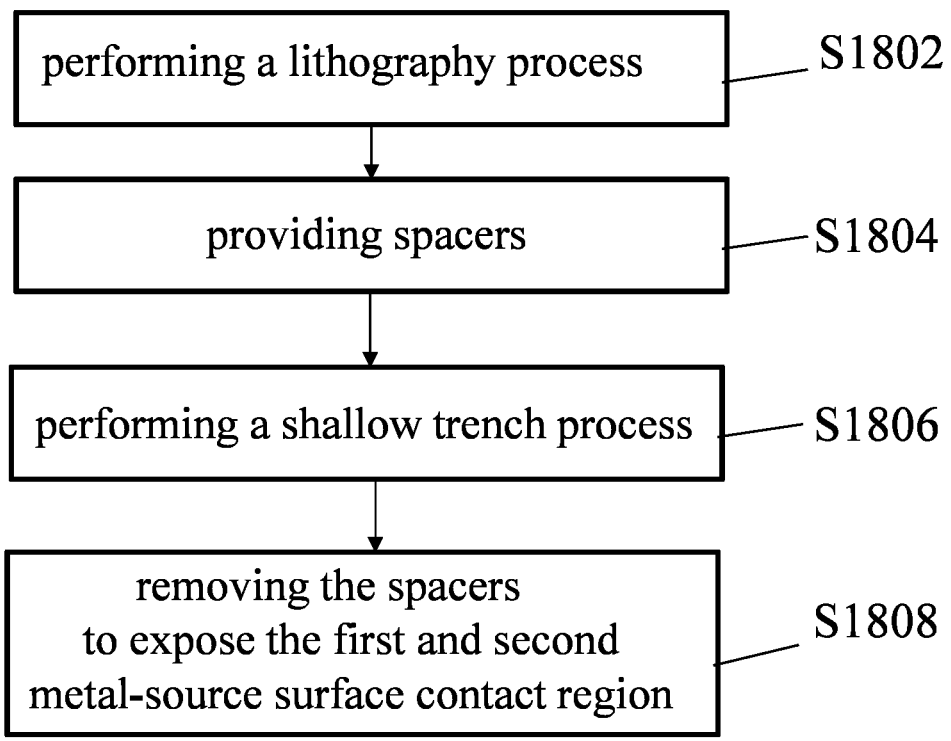
FIG. 18 schematically shows a process flow chart illustrating the steps of the proposed fabrication process method in accordance with the second embodiment of the present invention.

As such, please refer to FIG. 16, in which the present invention proceeds to remove the spacers 140, and after the spacers 140 are removed, it is apparent that the first metal-source surface contact region 801 and the second metal-source surface contact region 802 can be exposed (corresponding to the step of S1808 in FIG. 18). At this time, as the second embodiment of the present invention shows in these figures, the Applicants of the invention further provide a variant embodiment, in which each of the first dielectric layer 88A and the second dielectric layer 88B is formed in a rectangle shape.

As a result, as can be seen in FIG. 16, the metal contact window WD is accordingly obtained and formed in the transistor structure of the power device. And as such, the inter-layer dielectric 89 is divided by the metal contact window WD into the first dielectric layer 88A and the second dielectric layer 88B. In addition, the source heavily doped area 86 is also divided by the metal contact window WD into the first heavily doped region 86A and the second heavily doped region 86B. The first dielectric layer 88A is disposed on the first heavily doped region 86A, and the second dielectric layer 88B is disposed on the second heavily doped region 86B. And a contact length of the first dielectric layer 88A and the first heavily doped region 86A is less than a length of the first heavily doped region 86A such that a first metal-source surface contact region 801 can be exposed. Similarly, a contact length of the second dielectric layer 88B and the second heavily doped region 86B is less than a length of the second heavily doped region 86B such that a second metal-source surface contact region 802 can be exposed, too. Therefore, in view of the second embodiment of the present invention, the first metal-source surface contact region 801 and the second metal-source surface contact region 802 can be effectively exposed through depositing the spacers first, then performing the shallow trench process along opposite surfaces of the spacers, and eventually removing the spacers. By such design manners, it is believed that the horizontal surface contact for the subsequent source metal deposition can be increased. What differs from the previous first embodiment is that, according to the second embodiment, the length $L_{MS}$ of the exposed first metal-source surface contact region 801 and the second metal-source surface contact region 802 is dependent on a thickness of the spacer 140.

Generally, according to the second embodiment of the present invention, the length $L_{MS}$ of the exposed first metal-source surface contact region 801 and the second metal-source surface contact region 802 can be adjusted and determined by controlling a thickness of the spacer 140. For instance, according to the disclosed fabrication process method of the present invention, when the spacer 140 has a thickness of 0.2 μm to 1.0 μm, then it results in the subsequent exposed length $L_{MS}$ of the exposed first metal-source surface contact region 801 and the second metal-source surface contact region 802 to be 0.2 μm to 1.0 μm as well. And preferably, the thickness of the spacer 140 (corresponding to the exposed length $L_{MS}$ of the first metal-source surface contact region 801 and the second metal-source surface contact region 802) can be 0.3 μm. In other words, the present invention is able to determine the length of the exposed first metal-source surface contact region 801 and the second metal-source surface contact region 802 by varying the thickness of the spacer 140, so as to increase the horizontal surface contact of the source contact metal. And in a further aspect, according to the second embodiment of the present invention, when the thickness of the spacer 140 is taken as 0.3 μm, for example, then it indicates that the etching width of the contact window when performing the lithography process can be larger than that of the traditional process by 0.6 μm. As a result, it is believed that it is able to significantly enhance to reduce the difficulty and complexity of the current lithography etching process. Apart from these, when depositing the source metal, since the two spacers 140 on the sidewalls have been removed, and the enlarged contact window width can be obtained by 0.6 μm, it is also beneficial for forming the source metal having the step-like coverage and outline shape. As a result, it is obvious that by employing the process techniques disclosed in the second embodiment of the present invention, a step-like three-dimensional source contact structure can be successfully fabricated. In addition, the cell pitch can be reduced by 0.6 to 1.0 μm under the condition of maintaining the same contact area. Meanwhile, due to the process techniques of the present invention, it also allows to have a larger contact window pattern and advantageous for contact window lithography process going on.

In specific, according to the second embodiment in which when considering the step of removing the spacers 140, it is applicable to use hot phosphoric acid ($H_3PO_4$) for removing the spacers 140 when the spacers 140 are made of silicon nitride ($Si_3N_4$). Apart from these, when considering some feasible materials of the spacers 140, the spacers 140 are believed to be able to be made of silicon nitride ($Si_3N_4$), silicon dioxide ($SiO_2$), nickel (Ni), or a material not removable when subsequently performing the following shallow trench process. According to alternative embodiments of the present invention, when the spacers are made of other materials, then alternative removing agent may also be adopted for removing the spacers as well.

Taking the $Si_3N_4$ spacer as an example, then in such a step, a $Si_3N_4$ hard mask layer can be deposited first. After that, an anisotropic etching process can be adopted to form a gap there in between the $Si_3N_4$ hard mask layer, such that $Si_3N_4$ sidewalls are left. As a result, the structure as illustrated in FIG. 14 of the present invention, depicted by the spacers 140 respectively disposed on opposite sidewalls of the first dielectric layer 88A and the second dielectric layer 88B can be obtained.

Figure 17:
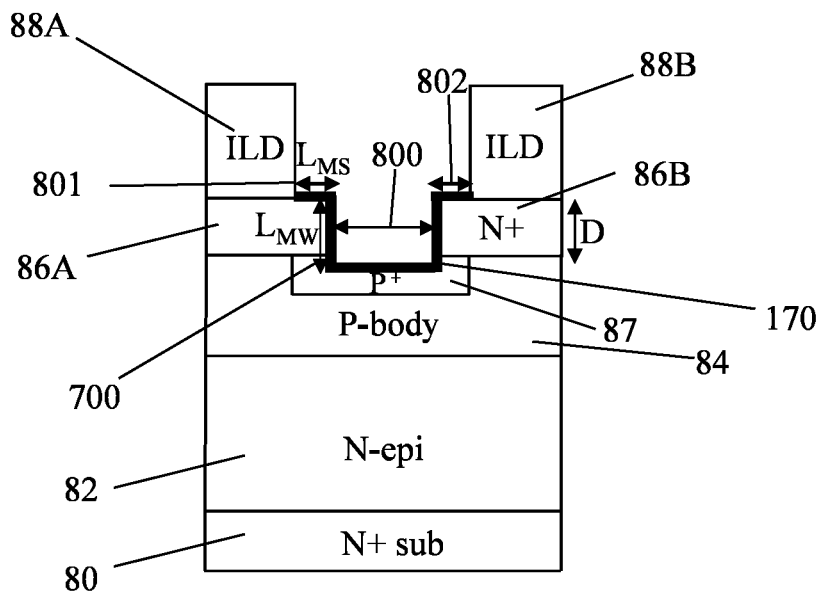
FIG. 17 schematically shows a structural diagram from FIG. 16 in which a source contact metal is deposited thereon.

As a result, as described in the step of S408 in FIG. 4, the present invention is able to proceed to deposit a source contact metal on the basis of the disclosed structure (FIG. 16), such that the source contact metal 170 as illustrated in FIG. 17 can be formed. On account of the above, it is believed that the source contact metal 170 formed by employing the disclosed process method is able to cover at least the above-mentioned first metal-source surface contact region 801, the above-mentioned second metal-source surface contact region 802, the longitudinal surface 700 along the first heavily doped region 86A and the second heavily doped region 86B, and the interval surface 800 between the first heavily doped region 86A and the second heavily doped region 86B, such that the source contact metal 170 formed in the second embodiment of the present invention has a step-like three-dimensional structure. As earlier described in the previous sections, the source contact metal 170 can be formed, for example, by depositing a contact metal first, such as nickel (Ni), and annealing it at a high temperature to form nickel-silicide (Ni-silicide). After that, a selective etching process can be carried out to remove the unreacted nickel, such that the source contact metal 170 as shown in FIG. 17 can be formed. As a result, according to the embodiment of the present invention, the source contact metal 170 formed by the present invention is characterized by having a step-like three-dimensional structure. And after that, a variety of subsequent steps are mostly the same as the standard processes in the existing VDMOSFET fabrication process. As for the following gate contact window lithography, etching processes, as well as metal deposition and metal layer lithography processes, these processes may further be performed by those skilled in the art for the subsequent flow processes.

Figure 19:
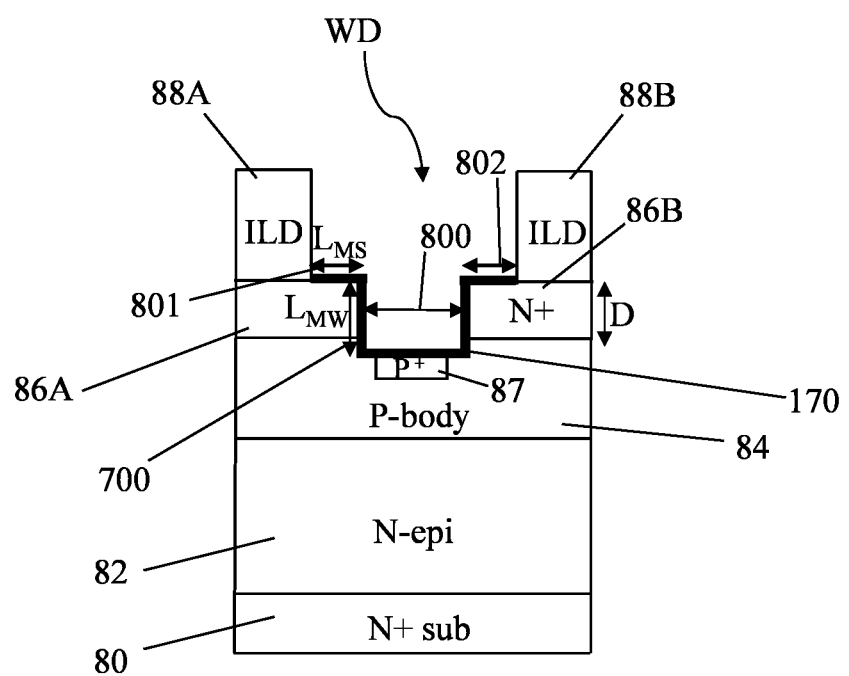
FIG. 19 schematically shows a structural diagram illustrating a width of the well region is narrower than a bottom width of the metal contact window in accordance with the second embodiment of the present invention.

It should be noted that, according to the embodiment of the present invention, the width of the well region 87 is designed as being greater than the bottom width of the metal contact window WD, for the purposes of providing a larger metal contact window and a subsequent easier lithography process of the metal contact window. However, the present invention is certainly not limited thereto such embodiment. According to some other embodiments of the present invention, then the width of the well region 87 may also be alternatively designed as being narrower than the bottom width of the metal contact window WD. Please refer to FIG. 19 for one another variant embodiment of the present invention, in which FIG. 19 shows a schematic view illustrating that the width of the well region can be narrower than the bottom width of the metal contact window. And therefore, it is also believed that the variant embodiment may also be utilized for forming the three-dimensional source contact structure of the present invention.

To sum up, it is apparent that the Applicants of the present invention provide at least two various process methods (as described in the process steps in FIG. 10 and FIG. 18) to generate the exposed first metal-source surface contact region and the exposed second metal-source surface contact region, such that by the exposed lateral surfaces, the horizontal surface contact when depositing the source metal can be significantly increased. Based on such technical features, it is guaranteed that the main spirits of the present invention include utilizing the silicon carbide shallow trench process to provide the longitudinal vertical contact between the metal and source region (the exposed longitudinal surface). Apart from that, the first embodiment of the present invention, wherein a lateral etching process is applied to the inter-layer dielectric; or the second embodiment of the present invention, wherein the spacers (such as $Si_3N_4$ spacers) are provided and eventually removed, can be alternatively adopted to provide the horizontal surface contact between the metal and source region (generating the exposed first metal-source surface contact region and the exposed second metal-source surface contact region). As a result, it is effective and ensured that a three-dimensional source contact structure applicable to a power device can be successfully fabricated and obtained by employing the present invention.

In addition, according to the disclosed technical contents of the present invention, when the P+ well region is provided and buried underneath the N+ heavily doped area, the P+ well region can be easily exposed after etching the N+ heavily doped area in the contact window region. Therefore, by designing the width of the P+ well region greater than the bottom width of the metal contact window WD, the surface area occupied by the P+ well region between the left and right N+ sources can be omitted when performing layout processes, in order to further reduce the cell pitch by approximately 0.5 μm to 2.0 μm.

As a result, as set forth, it is believed that by employing the disclosed embodiments and process methods of the present invention, it achieves in effectively reducing not only the cell pitch but also the fabrication process complexity, especially under the condition that the same contact area and symmetric contact area at the left and right sides of the source region can be maintained. Therefore, the technical solutions disclosed in this application are not only advantageous in terms of process complexity and cost considerations, but also valuable in industrial applications. Among all, for people who are skilled in the art and have knowledge in the backgrounds, it should be feasible for adjustments and modifications to be made without departing from the main spirits of the application according to their actual requirements of the transistor type, electrical characteristics, channel lengths, and so on, Nevertheless, based on the equality, it is believed that these variations should still fall into the scope of the application of the present invention.

Meanwhile, it is worth noting that, as previously mentioned, since the present invention is aimed to provide modifications and improvements regarding the source contact region 331 as illustrated in FIG. 3, some other standard structures, such as the dielectric layer and source heavily doped area outside the source contact region or in between the first and second heavily doped regions should be well known by people skilled in the art. Since these technical contents are mostly the current standard processes and are not the main technical spirits claimed by the Applicant's invention, these descriptions are not intended to be proposed herein the present invention.

And even furthermore, it should be also noted that, the present invention is not limited by the semiconductor conductivity type used in the embodiments. In other words, according to the present invention, the above-mentioned semiconductor substrate, the epitaxial layer, the first heavily doped region and the second heavily doped region of the disclosed invention have a first semiconductor type. And the body region and the well region have a second semiconductor type. The first semiconductor type and the second semiconductor type are opposite conductivity types. Therefore, in one embodiment of the present invention, when the first semiconductor type is N type, the second semiconductor type will be P type. And in an alternative embodiment of the present invention, when the first semiconductor type is P type, then the second semiconductor type will be N type. That is to say, based on the technical solutions provided by the present invention, the disclosed three-dimensional source contact structure can be effectively formed on an N-type heavily doped substrate. And based on the same principles, the disclosed three-dimensional source contact structure may also be applicable to a P-type heavily doped substrate and formed on the P-type heavily doped substrate. The above-mentioned first and second semiconductor types are not intended to limit the claim scopes of the invention.

As a result, in view of the above-mentioned technical features, it is guaranteed that the present invention proposes an extremely novel and inventive process method. Compared with the prior art, it is believed that the embodiments disclosed in the present invention and the process method thereof can effectively solve the existing deficiencies in the prior art. In addition, according to the fabrication process method disclosed in the present invention, it can be effectively applied to silicon carbide substrate, and further to any other substrate which is made of semiconductor materials, even with a wide energy gap. Apart from these, according to the fabrication process method disclosed in the present invention, it is obvious that the fabrication process method can be applied to a general Vertical Double Diffused Metal Oxide Semiconductor Field Effect Transistor (VDMOSFET) or to a general U-shaped Metal Oxide Semiconductor Field Effect Transistors (UMOSFET). Alternatively, it can be further widely applied to any power transistor which includes the VDMOSFET or the UMOSFET structure, for example, an Insulated Gate Bipolar Transistor (IGBT), such that a three-dimensional source contact structure can be made therein. And even more, for any other power devices which include the MOSFET structure on its semiconductor top surface, the present invention is also applicable. As a result, the Applicants assert that the present invention is instinct, effective and highly competitive for the incoming technologies, industries and researches developed in the future. And since the technical features, means and effects achieved by the present invention are significantly different from the current solutions and can not be accomplished easily by those who are familiar with the industry, it is thus believed that the present invention is indeed characterized by patentability and shall be patentable soon in a near future.

It is also worth reminding that the present invention is not limited to the above-mentioned process layouts. In other words, those skilled in the art are able to make equivalent modifications and variations based on their actual product specifications. And yet, it is believed that such modified embodiments should still fall within the scope of the present invention.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. A process method for fabricating a three-dimensional source contact structure applicable to a power device, comprising:
   providing a semiconductor substrate and sequentially forming an epitaxial layer and a body region on the semiconductor substrate;
   providing a well region buried in the body region and sequentially forming a source heavily doped area and an inter-layer dielectric on the well region;
   forming a metal contact window in the power device, such that the inter-layer dielectric is divided by the metal contact window into a first dielectric layer and a second dielectric layer and the source heavily doped area is divided by the metal contact window into a first heavily doped region and a second heavily doped region, wherein the first dielectric layer is disposed on the first heavily doped region, the second dielectric layer is disposed on the second heavily doped region, and wherein a contact length of the first dielectric layer and the first heavily doped region is less than a length of the first heavily doped region such that a first metal-source surface contact region is exposed, and wherein a contact length of the second dielectric layer and the second heavily doped region is less than a length of the second heavily doped region such that a second metal-source surface contact region is exposed; and
   depositing a source contact metal which is configured between the first dielectric layer and the second dielectric layer, between the first heavily doped region and the second heavily doped region, and on the well region, wherein the source contact metal covers at least the first metal-source surface contact region, the second metal-source surface contact region, a longitudinal surface along the first heavily doped region and the second heavily doped region, and an interval surface between the first heavily doped region and the second heavily doped region, such that the source contact metal has a step-like three-dimensional structure.

2. The process method according to claim 1, wherein in the step of forming the metal contact window further comprises:

sequentially performing a lithography process to the inter-layer dielectric and performing a shallow trench process to the source heavily doped area to divide the inter-layer dielectric and the source heavily doped area and form a spacing; and performing a lateral etching process to the inter-layer dielectric wherein the spacing is formed to expose the first metal-source surface contact region and the second metal-source surface contact region and forming the first dielectric layer and the second dielectric layer.

3. The process method according to claim 2, wherein each of the first dielectric layer and the second dielectric layer is formed in a trapezoid shape.

4. The process method according to claim 2, wherein the shallow trench process divides the source heavily doped area into the first heavily doped region and the second heavily doped region formed on opposite sides of the metal contact window and exposes the longitudinal surface along the first heavily doped region and the second heavily doped region and the interval surface between the first heavily doped region and the second heavily doped region.

5. The process method according to claim 2, wherein an etching depth of the shallow trench process is not less than a thickness of the first heavily doped region and the second heavily doped region to expose the longitudinal surface along the first heavily doped region and the second heavily doped region.

6. The process method according to claim 2, wherein the first metal-source surface contact region and the second metal-source surface contact region are formed by performing the lateral etching process to the inter-layer dielectric.

7. The process method according to claim 2, wherein the lateral etching process is performed by a wet etching process.

8. The process method according to claim 1, wherein in the step of forming the metal contact window further comprises:

performing a lithography process to the inter-layer dielectric to divide the inter-layer dielectric into the first dielectric layer and the second dielectric layer formed on opposite sides of the metal contact window;

providing a spacer respectively on opposite sidewalls of the first dielectric layer and the second dielectric layer;

performing a shallow trench process along opposite surfaces of two of the spacers to divide the source heavily doped area into the first heavily doped region and the second heavily doped region; and removing the spacers to expose the first metal-source surface contact region and the second metal-source surface contact region.

9. The process method according to claim 8, wherein each of the first dielectric layer and the second dielectric layer is formed in a rectangle shape.

10. The process method according to claim 8, wherein the shallow trench process divides the source heavily doped area into the first heavily doped region and the second heavily doped region formed on opposite sides of the metal contact window and exposes the longitudinal surface along the first heavily doped region and the second heavily doped region and the interval surface between the first heavily doped region and the second heavily doped region.

11. The process method according to claim 8, wherein an etching depth of the shallow trench process is not less than a thickness of the first heavily doped region and the second heavily doped region to expose the longitudinal surface along the first heavily doped region and the second heavily doped region.

12. The process method according to claim 8, wherein the shallow trench process is performed by a plasma etching process.

13. The process method according to claim 8, wherein the spacer is made of silicon nitride ($Si_3N_4$), silicon dioxide ($SiO_2$), nickel (Ni), or a material not removable when performing the shallow trench process.

14. The process method according to claim 8, wherein a thickness of the spacer is between 0.2 μm and 1.0 μm.

15. The process method according to claim 8, wherein the spacers are removed by using hot phosphoric acid ($H_3PO_4$).

16. The process method according to claim 1, wherein a length of the first metal-source surface contact region and the second metal-source surface contact region is between 0.2 lam and 1.0 μm.

17. The process method according to claim 1, wherein a depth of the longitudinal surface along the first heavily doped region and the second heavily doped region is between 0.2 μm and 0.5 μm.

18. The process method according to claim 1, wherein a width of the well region is greater than a bottom width of the metal contact window.

19. The process method according to claim 1, wherein the power device includes a Vertical Double Diffused Metal Oxide Semiconductor Field Effect Transistor (VDMOSFET) or an U-shaped Metal Oxide Semiconductor Field Effect Transistor (UMOSFET), and the step-like three-dimensional structure is applicable to the source contact metal of the VDMOSFET or the UMOSFET.

20. The process method according to claim 1, wherein the semiconductor substrate, the epitaxial layer, the first heavily doped region and the second heavily doped region have a first semiconductor type, the body region and the well region have a second semiconductor type, and the first semiconductor type and the second semiconductor type are opposite conductivity types.

21. The process method according to claim 1, wherein the semiconductor substrate is made of silicon (Si), silicon carbide (SiC), gallium oxide ($Ga_2O_3$), aluminum nitride (AlN), or diamond.

22. The process method according to claim 1, wherein a material of the source contact metal comprises Ni-silicide.

* * * * *